US012777593B2

(12) United States Patent
Song et al.

(10) Patent No.: US 12,777,593 B2
(45) Date of Patent: Oct. 27, 2026

(54) ELECTRONIC DEVICE

(71) Applicant: HONOR DEVICE CO., LTD., Shenzhen (CN)

(72) Inventors: Shaohua Song, Shenzhen (CN); Chuan Xu, Shenzhen (CN); Peng Zhang, Shenzhen (CN); Jiuli Zhang, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 122 days.

(21) Appl. No.: 18/711,853

(22) PCT Filed: Apr. 20, 2023

(86) PCT No.: PCT/CN2023/089587
§ 371 (c)(1),
(2) Date: May 20, 2024

(87) PCT Pub. No.: WO2023/246268
PCT Pub. Date: Dec. 28, 2023

(65) Prior Publication Data

US 2025/0040065 A1 Jan. 30, 2025

(30) Foreign Application Priority Data

Jun. 22, 2022 (CN) ......................... 202221590740.1

(51) Int. Cl.
*H05K 5/02* (2006.01)
*H05K 5/00* (2006.01)

(52) U.S. Cl.
CPC ......... *H05K 5/0217* (2013.01); *H05K 5/0018* (2022.08)

(58) Field of Classification Search
None
See application file for complete search history.

(56) References Cited

U.S. PATENT DOCUMENTS 9,192,046 B2 * 11/2015 Malek .................... H05K 3/361
9,693,473 B2 * 6/2017 Hibino ................ H05K 7/1427
(Continued)

FOREIGN PATENT DOCUMENTS

CN 205754444 U 11/2016
CN 205812104 A 12/2016
(Continued)

OTHER PUBLICATIONS

Liu Wei et al; The application of modular design in the mobile phone industry; Machinery;Jul. 20, 2016;pp. 3(with English abstract).

*Primary Examiner* — Xanthia C Relford
(74) *Attorney, Agent, or Firm* — WOMBLE BOND DICKINSON (US) LLP

(57) ABSTRACT

Embodiments of this application provide an electronic device, including a screen component, a middle frame, a main board, a connector, and a flexible printed circuit board, the screen component and the middle frame enclose an accommodating cavity, the main board is located in the accommodating cavity, the connector is disposed on a side of the main board deviating from the screen component, the flexible printed circuit board connects the connector and the screen component, an assembly hole is disposed on the middle frame, and the assembly hole is disposed corresponding to the connector. The electronic device provided in embodiments of this application can resolve a problem in related technologies that an assembly length of the flexible printed circuit board is long, resulting in high costs of the electronic device and affecting quality of signal transmission from the main board to a screen end.

12 Claims, 3 Drawing Sheets

(56) References Cited

U.S. PATENT DOCUMENTS

| | | | | | |
|---|---|---|---|---|---|
| 9,716,781 | B2 * | 7/2017 | Lee | H01H 13/02 |
| 2011/0255850 | A1 * | 10/2011 | Dinh | G03B 15/03 396/176 |
| 2023/0421681 | A1 | 12/2023 | Cai | |

FOREIGN PATENT DOCUMENTS

| | | | | | |
|---|---|---|---|---|---|
| CN | 105934130 | B | | 2/2019 | |
| CN | 113055511 | A | | 6/2021 | |
| CN | 113658519 | A | | 11/2021 | |
| CN | 216490580 | U | * | 5/2022 | H04M 1/02 |
| WO | 2020097785 | A1 | | 5/2020 | |

* cited by examiner

ELECTRONIC DEVICE

CROSS-REFERENCE TO RELATED APPLICATIONS

This application is a national stage of International Application No. PCT/CN2023/089587, filed on Apr. 20, 2023, which claims priority to Chinese Patent Application No. 202221590740.1, filed on Jun. 22, 2022. The disclosures of both of the aforementioned applications are hereby incorporated by reference in their entireties.

TECHNICAL FIELD

Embodiments of this application relate to the technical field of electronic devices, and in particular, to an electronic device.

BACKGROUND

With the development of science and technology, electronic devices have been widely used in people's daily life. Especially mobile electronic devices, such as mobile phones and tablet computers, are developing rapidly as they are easy to carry and have practical functions that can meet people's daily needs.

An existing tablet computer is used as an example, including: a screen, a middle frame, a main board, a board to board (Board To Board, BTB) connector, and a flexible printed circuit board (Flexible Printed Circuit Board, FPCB). In related technologies, assembly of the tablet computer generally adopts an architectural design scheme of inverted assembly, to be specific, after assembling the main board on the middle frame, fasten the BTB connector on the main board, connect the FPCB to the screen and the BTB connector, assemble the BTB connector with a pressing steel sheet, lock the pressing steel sheet of the BTB connector, set up the screen, dispense glue on the middle frame, then fasten the screen to complete screen assembly, and finally maintain pressure.

However, under this assembly scheme, due to the need to set up the screen for dispensing glue on the middle frame with the screen, the FPCB requires a long assembly length, resulting in high costs for the tablet computer, and affecting quality of signal transmission from the main board to a screen end.

SUMMARY

Embodiments of this application provide an electronic device, and the electronic device may resolve a problem in related technologies that an assembly length of a flexible printed circuit board is long, resulting in high costs of the electronic device and affecting quality of signal transmission from a main board to a screen end.

Embodiments of this application provide an electronic device, including a screen component, a middle frame, a main board, a connector, and a flexible printed circuit board, the screen component and the middle frame enclose an accommodating cavity, the main board is located in the accommodating cavity, the connector is disposed on a side of the main board deviating from the screen component, the flexible printed circuit board connects the connector and the screen component, an assembly hole is disposed on the middle frame, and the assembly hole is disposed corresponding to the connector.

The electronic device provided in embodiments of this application disposes the connector on the side of the main board deviating from the screen component, and disposes the assembly hole on the middle frame, where the assembly hole is disposed corresponding to the connector. In this way, when the electronic device is assembled, the following steps may be taken: assembling the main board in the accommodating cavity, dispensing glue on the middle frame, fastening the screen component that is connected to the flexible printed circuit board, assembling the connector on the main board through the assembly hole, then connecting the flexible printed circuit board to the connector, and locking the connector on the main board using a pressing steel sheet through the assembly hole. In comparison with related technologies, the screen component is directly fastened to the middle frame, and there is no need to set up the screen component for glue dispensing with the screen, thereby reducing the difficulty of assembly. In addition, as there is no need for glue dispensing with the screen, the assembly length of the flexible printed circuit board can be reduced. In some embodiments of this application, the assembly length of the flexible printed circuit board can be reduced by more than 50 mm to 100 mm, thereby achieving the goal of cost reduction. Due to the reduced assembly length of the flexible printed circuit board, quality of signal transmission from the main board to the screen component can also be improved. In addition, there is no need to develop a new glue dispensing and assembly device, and no need to modify a glue dispensing device and a screen assembly device in related technologies, the devices in related technologies may be directly used.

In a possible implementation, the electronic device further includes a pressing piece, where the pressing piece is disposed in the assembly hole, and the pressing piece presses the connector on the main board. In this way, the connector can be directly pressed on the main board through the pressing piece, without the need to lock the connector with the steel sheet.

In a possible implementation, the pressing piece is formed by disassembling the middle frame, and the assembly hole is formed at a disassembly point of the middle frame.

In this way, a fitting degree between the pressing piece and the middle frame can be improved, thereby enhancing a pressing effect of the pressing piece on the connector.

In a possible implementation, the pressing piece is an exterior accessory of the electronic device.

In a possible implementation, a mounting groove is disposed on an inner side wall of the assembly hole, a protrusion is disposed on an outer side wall of the pressing piece, and the protrusion is clamped in the mounting groove. In this way, stability of the pressing piece can be improved, thereby enhancing stability of the connector on the main board.

In a possible implementation, a protrusion is disposed on an inner side wall of the assembly hole, a mounting groove is disposed on an outer side wall of the pressing piece, and the protrusion is clamped in the mounting groove. In this way, the stability of the pressing piece can be improved, thereby enhancing the stability of the connector on the main board.

In a possible implementation, a first step is disposed at an outer edge of the assembly hole on a side of the middle frame deviating from the screen component, and the pressing piece is assembled on the first step. In this way, the stability of the pressing piece can be improved, thereby enhancing the stability of the connector on the main board.

In a possible implementation, the connector is disposed near a side of the main board. In this way, the assembly length of the flexible printed circuit board can be further reduced.

In a possible implementation, the screen component includes a display screen and a touch panel that are stacked; and the touch panel is located on a side of the display screen deviating from the accommodating cavity.

In a possible implementation, the screen component further includes a mounting frame, the mounting frame is disposed on a periphery of the display screen and the touch panel, and the mounting frame is connected to the middle frame.

In a possible implementation, the mounting frame has a second step on a side facing the accommodating cavity, a third step is disposed on the middle frame, and the second step cooperates with the third step to achieve connection between the mounting frame and the middle frame.

In a possible implementation, the electronic device further includes a rear cover, and the rear cover is disposed on a side of the middle frame deviating from the screen component.

BRIEF DESCRIPTION OF DRAWINGS

To describe the technical solutions in this application or existing technologies more clearly, the following briefly describes accompanying drawings required for describing the embodiments or existing technologies. Apparently, the accompanying drawings in the following descriptions show some embodiments of this application, and a person of ordinary skill in the art may still derive other drawings from these accompanying drawings without creative efforts.

DESCRIPTION OF REFERENCE NUMERALS

100—electronic device;
10—screen component;
11—display screen;
12—touch panel;
13—mounting frame;
131—second step;
20—middle frame;
21—middle plate;
211—mounting groove;
22—frame;
23—accommodating cavity;
24—assembly hole;
25—first step;
26—third step;
27—accommodating groove;
30—main board;
40—connector;
50—flexible printed circuit board;
60—glue;
70—pressing piece;
71—protrusion;
80—rear cover;
81—rear camera; and
90—pressing steel sheet.

DESCRIPTION OF EMBODIMENTS

Terms used in the description of embodiments of this application are merely used to explain specific embodiments of this application, but are not intended to limit this application, the description of embodiments in embodiments of this application are described in detail in the following with reference to the accompanying drawings.

An electronic device provided in embodiments of this application, may include but is not limited to a mobile phone, a tablet computer, a watch, a notebook computer, an ultra-mobile personal computer (Ultra-mobile Personal Computer, UMPC), a handheld computer, a walkie-talkie, a netbook, a POS machine, a personal digital assistant (Personal Digital Assistant PDA), a dash cam, a security device, a wearable device, a virtual reality device, and other mobile or fixed terminals with display screens. Embodiments of this application are illustrated using a tablet computer as an example.

Figure 1:
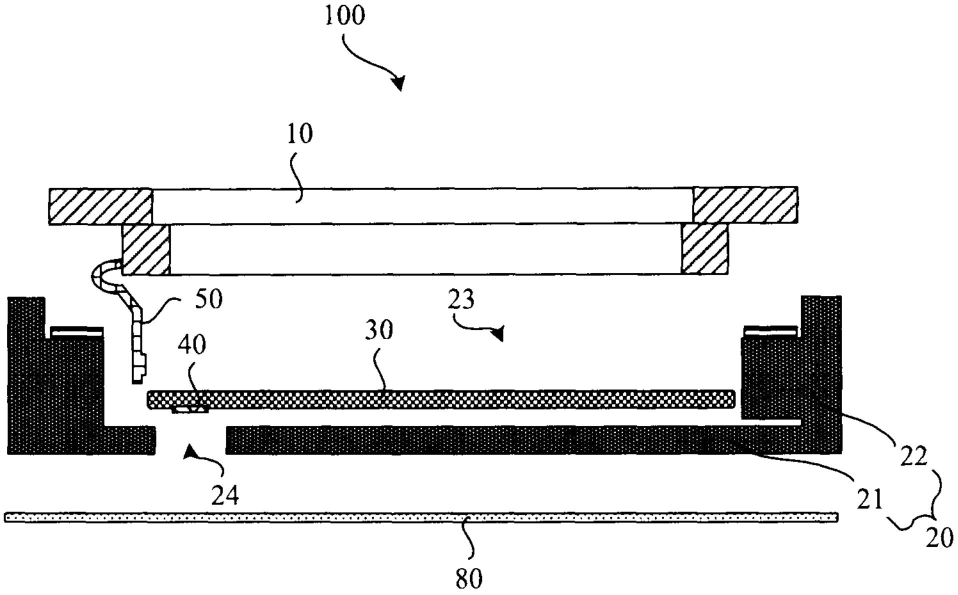
FIG. 1 is a schematic diagram of a disassembled structure of an electronic device according to an embodiment of this application.

A tablet computer (Tablet Personal Computer) is a small, portable personal computer that uses a touchscreen as a basic input device. FIG. 1 is a schematic diagram of a disassembled structure of an electronic device 100 according to an embodiment of this application. Refer to FIG. 1. The electronic device 100 provided in this embodiment of this application includes a screen component 10, a middle frame 20, and a main board 30. The screen component 10 and the middle frame 20 enclose an accommodating cavity 23. The main board 30 is located in the accommodating cavity 23.

The middle frame 20 may include a middle plate 21 and a frame 22. The frame 22 is disposed around an outer periphery of the middle plate 21. Generally, the frame 22 may include a top frame, a bottom frame, a left frame, and a right frame. The top frame, the bottom frame, the left frame, and the right frame form the frame 22 that is of a square ring structure. Materials of the middle plate 21 and the frame 22 include but are not limited to metals, ceramics, plastics, glass, and the like. The metals include but are not limited to aluminum, aluminum alloy, stainless steel, steel aluminum composite die-casting plate, titanium alloy, magnesium alloy, and the like. The materials of the middle plate 21 and the frame 22 may be the same or different. The middle plate 21 and the frame 22 may be clamped, welded, glued, or integrally formed, or the middle plate 21 and the frame 22 may be fixed and connected by injection molding.

The electronic device 100 may also include a battery (not shown in the figure) and a rear cover 80. The rear cover 80 is disposed on a side of the middle frame 20 deviating from the screen component 10. The rear cover 80 may be a metal rear cover 80, a glass rear cover 80, a plastic rear cover 80, or a ceramic rear cover 80. In embodiments of this application, a material of the rear cover 80 is not limited, or limited to the foregoing examples.

The battery may be disposed on a side of the middle frame 20 facing the screen component 10 or on a side of the middle frame 20 facing the rear cover 80. For example, the side of the middle frame 20 facing the rear cover 80 may have a battery compartment (not shown in the figure). The battery is installed in the battery compartment. The battery may be connected to the main board 30 through a power management module and a charging management module. The power management module receives inputs from the battery and/or the charging management module and supplies power to a processor, an internal memory, an external memory, the screen component 10, a camera module, a communication module, and the like. The power management module may also be configured to detect parameters such as a battery capacity, battery cycle times, and a battery health status (leakage, impedance). In some other embodiments, the power management module may alternatively be disposed in a processor of the main board 30. In other embodiments, the power management module and the charging management module may alternatively be disposed in a same device.

When the tablet computer is a flat screen tablet computer, the screen component 10 may use an organic light-emitting diode (Organic Light-Emitting Diode, OLED) display screen or a liquid crystal display (Liquid Crystal Display, LCD).

It should be noted that in some examples, the rear cover 80 of the tablet computer may be connected to the frame 22 to form an integrated rear cover. For example, the tablet computer may include the screen component 10, the middle plate 21, and the rear cover 80. The rear cover 80 may be a rear cover formed by integrating the frame 22 and the rear cover 80. In this way, the battery can be located in space enclosed by the middle plate 21 and the rear cover 80.

In addition, a hole may be disposed on the rear cover 80, to serve as a light-transmitting region of a rear camera 81. Similarly, a hole may be disposed on the screen component 10, to serve as a light-transmitting region of a front camera.

The electronic device 100 provided in this embodiment of this application further includes a connector 40 and a flexible printed circuit board 50. The connector 40 is disposed on the main board 30. The connector 40 generally is a board to board (Board To Board, BTB) connector. The flexible printed circuit board 50 (Flexible Printed Circuit Board, FPCB) connects the connector 40 and the screen component 10 to implement electrical connection between the screen component 10 and the main board 30.

It can be understood that a structure illustrated in this embodiment of this application does not constitute a specific limitation on the electronic device 100. In some other embodiments in embodiments of this application, the electronic device 100 may include more or fewer components than those shown in the figure, or some components may be combined, or some components may be divided, or different component arrangements may be used. The illustrated components may be implemented in hardware, software, or a combination of software and hardware. In addition, filling graphics of components in the diagram are merely for the convenience of distinguishing components, and do not represent that the components are made of the same or different materials.

It should be understood that FIG. 1 is not drawn according to actual proportions of each part, and the same applies to other accompanying drawings. Therefore, this application should not be limited to proportions, dimensions, and the like shown in the accompanying drawings. In addition, in this application, "connected" or "electrically connected" may not only mean that the two are directly connected, but also mean that the two are connected through one or more intermediate devices. In this application, "installation" and "assembly" may include any existing installation method, for example, one component may be fixed on, under, or in another component through connectors (such as bolts, rivets) and/or adhesives. These understandings fall within a scope of embodiments of this application.

Figure 2:
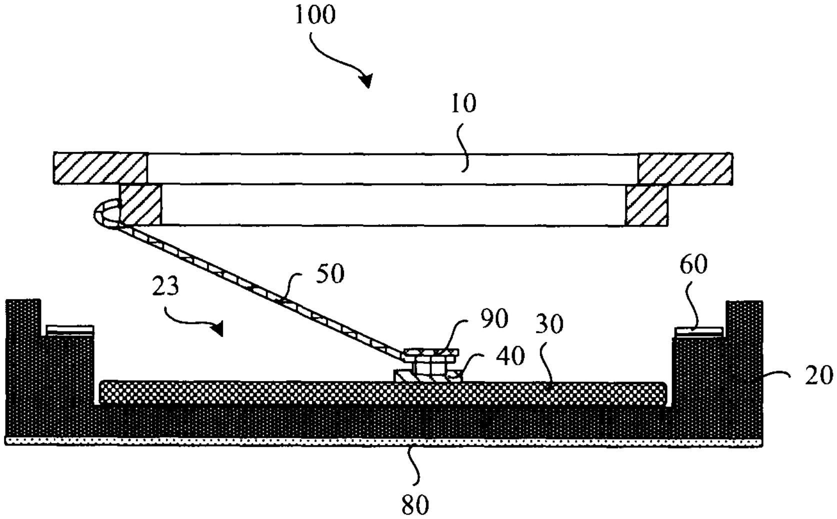
FIG. 2 is a schematic diagram of a disassembled structure of an electronic device in related technologies.

Regarding assembly of the electronic device 100, FIG. 2 is a schematic diagram of a disassembled structure of an electronic device 100 in related technologies. Refer to FIG. 2. In related technologies, the electronic device 100 generally adopts an inverted assembly scheme, to be specific, after assembling the main board 30 in the accommodating cavity 23, fasten the connector 40 on the main board 30, connect the flexible printed circuit board 50 to the screen component 10 and the connector 40, assemble the connector 40 with a pressing steel sheet 90, lock the pressing steel sheet 90 of the connector 40, set up the screen component 10, dispense glue on the middle frame 20 (glue 60), then fasten the screen component 10 to complete assembly of the screen component 10, and finally maintain pressure. In related technologies, the connector 40 is disposed on a side of the main board 30 facing the screen component 10.

However, under this assembly scheme, due to the need to set up the screen component 10 for dispensing glue on the middle frame 20 and the screen, inconvenience in operation is caused, and the flexible printed circuit board 50 requires a long assembly length, resulting in high costs for the electronic device 100. In addition, since the flexible printed circuit board 50 requires the long assembly length, quality of signal transmission from the main board 30 to the screen component 10 is also affected.

To resolve the foregoing problem, the electronic device 100 provided in embodiments of this application changes the inverted assembly scheme in related technologies into normal assembly by disposing the connector 40 on a side of the main board 30 deviating from the screen component 10 and disposing an assembly hole 24 on the middle frame 20, where the assembly hole 24 is disposed corresponding to the connector 40, thereby reducing the difficulty of assembly, shortening the length of the flexible printed circuit board 50, reducing costs, and improving the quality of signal transmission from the main board 30 to the screen component 10.

The electronic device 100 provided in embodiments of this application is further described in the following with reference to the accompanying drawings and specific embodiments.

Still refer to FIG. 1. In the electronic device 100 provided in embodiments of this application, the connector 40 is disposed on the side of the main board 30 deviating from the screen component 10, the flexible printed circuit board 50 is used to connect the connector 40 and the screen component 10, and the assembly hole 24 is disposed on the middle frame 20, where the assembly hole 24 is disposed corresponding to the connector 40.

It should be understood that the electronic device 100 provided in embodiments of this application disposes the connector 40 on the side of the main board 30 deviating from the screen component 10, and disposes the assembly hole 24 on the middle frame 20, where the assembly hole 24 is disposed corresponding to the connector 40. In this way, when the electronic device 100 is assembled, the following steps may be taken: assembling the main board 30 in the accommodating cavity 23, dispensing glue on the middle frame 20, fastening the screen component 10 that is connected to the flexible printed circuit board 50, assembling the connector 40 on the main board 30 through the assembly hole 24, then connecting the flexible printed circuit board 50 to the connector 40, and locking the connector 40 on the main board 30 using the pressing steel sheet 90 through the assembly hole 24. For example, after the screen component 10 is fastened to the middle frame 20, the connector 40 can be fastened through the assembly hole 24. The flexible printed circuit board 50 is electrically connected to the main board 30 through the connector 40. At the assembly hole 24, the pressing steel sheet 90 locks the connector 40 on the main board 30. In comparison with related technologies, the screen component 10 is directly fastened to the middle frame 20, and there is no need to set up the screen component 10 for glue dispensing with the screen, thereby reducing the difficulty of assembly. In addition, as there is no need for glue dispensing with the screen, the assembly length of the flexible printed circuit board 50 can be reduced. In some embodiments of this application, the assembly length of the flexible printed circuit board 50 can be reduced by more than 50 mm to 100 mm, thereby achieving the goal of cost reduction. Due to the reduced assembly length of the flexible printed circuit board 50, the quality of signal transmission from the main board 30 to the screen component 10 can also be improved. In addition, there is no need to develop a new glue dispensing and assembly device, and no need to modify a glue dispensing device and a screen assembly device in related technologies, the devices in related technologies may be directly used.

To further reduce the length of the flexible printed circuit board 50, the connector 40 may be disposed near a side of the main board 30 (as shown in FIG. 1).

Figure 3:
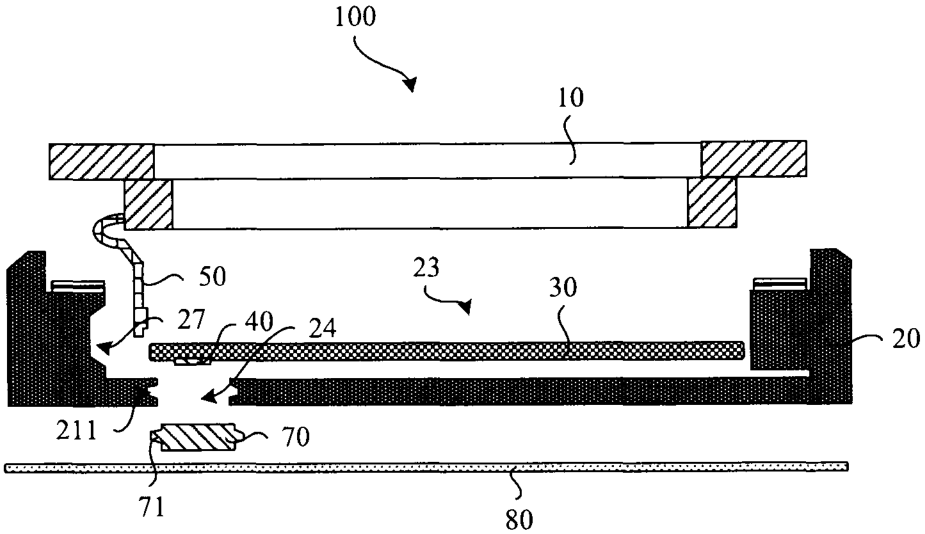
FIG. 3 is a schematic diagram of a disassembled structure of an electronic device according to an embodiment of this application.
Figure 4:
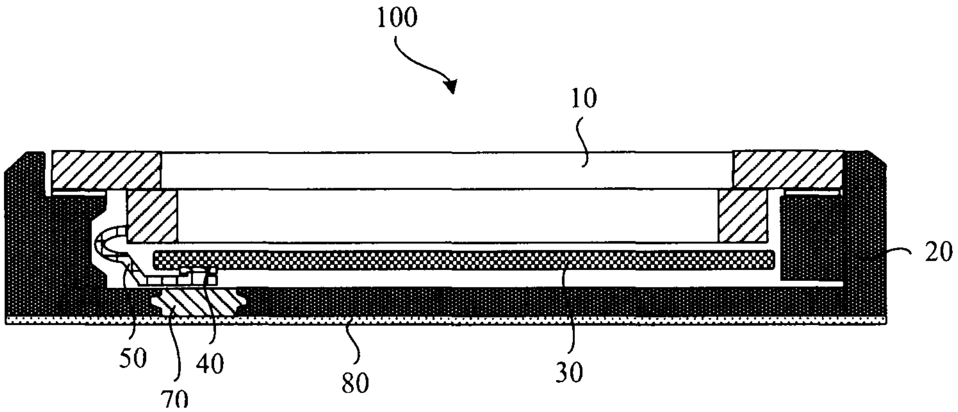
FIG. 4 is a schematic diagram of a structure of an electronic device in FIG. 3 after assembly.

It is clear that this application is not limited thereto. FIG. 3 is a schematic diagram of a disassembled structure of an electronic device 100 according to an embodiment of this application. FIG. 4 is a schematic diagram of a structure of an electronic device 100 in FIG. 3 after assembly. Refer to FIG. 3 and FIG. 4. In some embodiments of this application, the electronic device 100 may further include a pressing piece 70. The pressing piece 70 is disposed on the assembly hole 24, and the pressing piece 70 presses the connector 40 on the main board 30. After the flexible printed circuit board 50 is connected to the connector 40, the connector 40 can be directly pressed on the main board 30 through the pressing piece 70, without the need to lock the connector 40 with the steel sheet, for example, there is no need to lock the connector 40 with pressing steel sheet 90.

For example, when the electronic device 100 is assembled, the following steps may be taken: assembling the main board 30 in the accommodating cavity 23, dispensing glue on the middle frame 20, fastening the screen component 10 that is connected to the flexible printed circuit board 50 to the middle frame 20, after the screen component 10 is fastened to the middle frame 20, the connector 40 is fastened through the assembly hole 24, so that electrical connection can be achieved between the flexible printed circuit board 50 and the main board 30 through the connector 40. At the assembly hole 24, the pressing piece 70 presses the connector 40 on the main board 30.

Still refer to FIG. 3 and FIG. 4. In some embodiments of this application, an accommodating groove 27 may be disposed on an inner side wall of the frame 22, the accommodating groove 27 may accommodate the flexible printed circuit board 50 to protect the flexible printed circuit board 50.

In some embodiments of this application, the pressing piece 70 may be formed by disassembling the middle frame 20, it can be understood that the pressing piece 70 is formed by cutting and separating from the middle frame 20, and the assembly hole 24 is formed at the disassembly and separation point of the middle frame 20. In this way, a fitting degree between the pressing piece 70 and the middle frame 20 can be improved, thereby enhancing a pressing effect of the pressing piece 70 on the connector 40. It is clear that in other embodiments, the pressing piece 70 may alternatively be a component that is separately manufactured.

The pressing piece 70 may alternatively be an exterior accessory of the electronic device 100, including but not limited to a product identification, a pogo pin (pogo pin), an exterior decorative disassembly part, or a camera. For example, the exterior decorative disassembly part may be used to decorate the rear camera 81.

In embodiments of this application, to implement a shooting function, the electronic device 100 may further include at least one camera module and flash light (not shown in the figure), and the camera module may be a front camera (not shown in the figure), the rear camera 81, or the like. There may be one or more front cameras or rear cameras 81. In some embodiments, a sum of the numbers of the front cameras and the rear cameras 81 disposed in the electronic device 100 may be 1 or N, where N is a positive integer greater than 1.

The camera module may include a lens, an optical filter, a bracket, a photosensitive element, a flexible board, a connector, and the like.

It should be noted that the camera module may be a camera module with a fixed focal length or a camera module with a variable focal length. When the camera module is a camera module with a variable focal length, the camera module may also include a focusing module (not shown in the figure), such as a focusing motor, and the focusing motor may be located on the bracket of the camera module.

In embodiments of this application, the optical filter may be set according to functional needs, for example, the optical filter may be an infrared cut filter (IR cut Filter, IRCF), the infrared cut filter can filter out an infrared light and prevent the infrared light from entering the photosensitive element and affecting imaging.

The photosensitive element may be a charge coupled device (charge coupled device, CCD) or a complementary metal-oxide-semiconductor (complementary metal-oxide-semiconductor, CMOS) phototransistor. The connector is used to electrically connect the flexible board to an image signal processor (Image Signal Processing, ISP) on the main board 30, and the image signal processing (ISP) is electrically connected to a digital signal processor (Digital Signal Processing, DSP). The image signal processor (ISP) and the digital signal processor (DSP) may be separately disposed on the main board 30, or the image signal processor (ISP) and the digital signal processor (DSP) may be integrated together and disposed on the main board 30.

When photos are taken, a shutter is opened, and light passes through the lens and is transmitted to the photosensitive element through the optical filter. A light signal is converted into an electrical signal, and the photosensitive element transmits the electrical signal to the image signal processor (ISP) for processing through the flexible board and the connector. The image signal processor (ISP) converts the electrical signal into a digital image signal, the image signal processor (ISP) outputs the digital image signal to the digital signal processor (DSP) for processing, and the digital signal processor (DSP) converts the digital signal into an image signal in standard RGB, YUV, and other formats.

Figure 5:
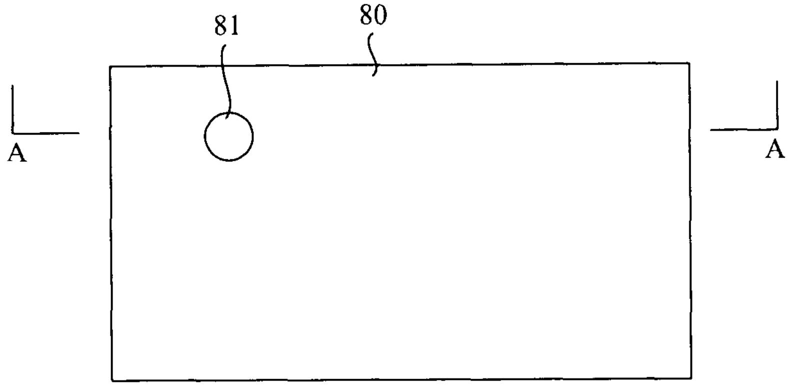
FIG. 5 is a schematic diagram of a back structure of an electronic device according to an embodiment of this application.
Figure 6:
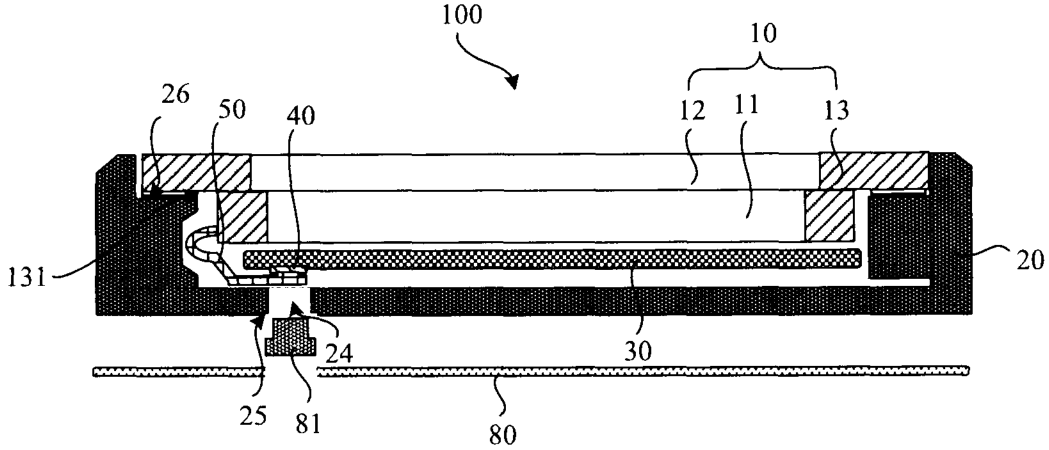
FIG. 6 is a schematic diagram of a cross-sectional structure according to a cutting line A-A in FIG. 5.
Figure 7:
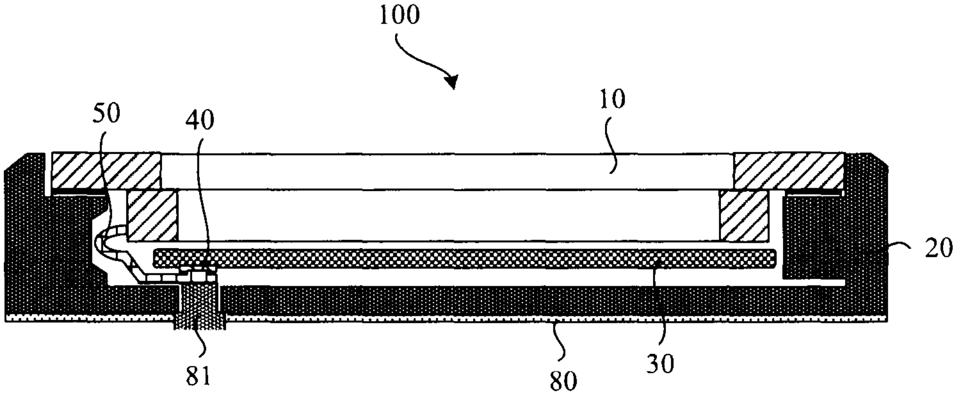
FIG. 7 is a schematic diagram of a structure of an electronic device in FIG. 6 after assembly.

For example, FIG. 5 is a schematic diagram of a back structure of an electronic device 100 according to an embodiment of this application. FIG. 6 is a schematic diagram of a cross-sectional structure according to a cutting line A-A in FIG. 5. FIG. 7 is a schematic diagram of a structure of an electronic device 100 in FIG. 6 after assembly. Refer to FIG. 5 to FIG. 7. The pressing piece 70 may be the rear camera 81 of the electronic device 100. The rear camera 81 is assembled in the assembly hole 24 and presses the connector 40 to achieve a purpose of pressing the connector 40 on a back of the middle frame 20.

Regarding a connection form between the pressing piece 70 and the middle frame 20, refer to FIG. 3 and FIG. 4. In some embodiments of this application, a mounting groove 211 is disposed on an inner side wall of the assembly hole 24, a protrusion 71 is disposed on the pressing piece 70, and the protrusion 71 is clamped in the mounting groove 211 to implement connection between the pressing piece 70 and the middle frame 20. In this way, stability of the pressing piece 70 can be improved, thereby enhancing stability of the connector 40 on the main board 30.

Similarly, alternatively, a protrusion may be disposed on the inner side wall of the assembly hole 24, a mounting groove is disposed on an outer side wall of the pressing piece 70, and the protrusion is clamped in the mounting groove to implement the connection between the pressing piece 70 and the middle frame 20.

Refer to FIG. 6 and FIG. 7. To improve the stability of the pressing piece 70, a first step 25 may be disposed on an outer edge of the assembly hole 24 on a side of the middle frame 20 deviating from the screen component 10. The pressing piece 70 is assembled on the first step 25, and assembly methods may be a series of conventional connection methods such as bonding, welding, and fastener connection.

Still refer to FIG. 6 and FIG. 7. In some embodiments of this application, the screen component 10 may include a display screen 11 and a touch panel 12 that are stacked. The touch panel 12 is located on a side of the display screen 11 deviating from the accommodating cavity 23. The touch panel 12 may be a resistive touchscreen, a capacitive screen, an infrared touchscreen, a surface acoustic wave touchscreen, and the like.

To ensure structural stability of the screen component 10 in the electronic device 100, in some embodiments of this application, the screen component 10 may also include a mounting frame 13. The mounting frame 13 is disposed on a periphery of the display screen 11 and the touch panel 12. The mounting frame 13 is connected to the middle frame 20. It is clear that connection between the screen assembly 10 and the middle frame 20 is not limited to the foregoing example, and may alternatively be directly connecting the display screen 11 and/or the touch panel 12 to the middle frame 20.

Still refer to FIG. 6 and FIG. 7. In some embodiments of this application, a second step 131 may be disposed on a side of the mounting frame 13 facing the accommodating cavity 23. A third step 26 is disposed on the middle frame 20. The second step 131 cooperates with the third step 26 to achieve connection between the mounting frame 13 and the middle frame 20. In this way, the structural stability of the screen component 10 in the electronic device 100 can be improved.

In summary, the electronic device 100 provided in embodiments of this application has a simple structure, and can reduce the difficulty of assembly of the electronic device 100, and reduce the assembly length of the flexible printed circuit board 50, so that the assembly length of the flexible printed circuit board 50 by more than 50 mm to 100 mm can be reduced, and cost benefits are achieved. In addition, there is no need to develop a new dispensing and assembly device, or modify a dispensing and screen assembly device in related technologies. A general device in related technologies can be directly used to achieve cost benefits. In addition, the reduction of the flexible printed circuit board 50 can improve the quality of signal transmission between the main board 30 and the screen component 10.

In the descriptions of this application, it should be understood that the terms "length", "width", "up", "down", "front", "back", "left", "right", "vertical", "horizontal", "top", "bottom", "inside", "outside", and the like indicate orientation or positional relationships based on the orientation or positional relationships shown in the accompanying drawings, are used merely for the convenience of describing this application and simplifying the description instead of indicating or implying that the apparatus or component referred to should have a specific orientation or be constructed and operated in a specific orientation. Therefore, the terms should not be understood as a limitation of this application.

In the descriptions of embodiments of this application, it should be noted that, unless otherwise explicitly stipulated and restricted, terms "installation", "joint connection", and "connection" should be understood broadly, which, for example, may be fixed connection, or may be indirect connection through a medium, or may be internal communication between two components, or may be an interactive relationship between two components. For a person of ordinary skill in the art, specific meanings of the foregoing terms in embodiments of this application may be understood based on specific circumstances.

In the specification, the claims, and the foregoing accompanying drawings of embodiments of this application, the terms "first", "second", "third", "fourth", and the like (if existing) are used to distinguish between similar objects, but do not limit a particular order or sequence.

Finally, it should be noted that the foregoing embodiments are merely intended for describing the technical solutions of embodiments of this application, but not for limiting the technical solutions of embodiments of this application. Although embodiments of this application are described in detail with reference to the foregoing embodiments, a person of ordinary skilled in the art should understand that modifications may still be made to the technical solutions described in the foregoing embodiments or equivalent replacements may be made to some or all of the technical features, and such modifications or replacements do not cause the essence of the corresponding technical solutions to depart from the scope of the technical solutions in embodiments of this application.

The invention claimed is:

1. An electronic device, comprising a screen component, a middle frame, a main board, a connector, a flexible printed circuit board, and a pressing piece, wherein the screen component and the middle frame enclose an accommodating cavity, the main board is located in the accommodating cavity, the connector is disposed on a side of the main board deviating from the screen component, and the flexible printed circuit board connects the connector and the screen component;

an assembly hole is disposed on the middle frame, and the assembly hole is substantially aligned with the connector; and the pressing piece is disposed in the assembly hole, and the pressing piece presses the connector onto the main board.

2. The electronic device according to claim 1, wherein the pressing piece is formed by disassembling the middle frame, and the assembly hole is formed at a disassembly point of the middle frame.

3. The electronic device according to claim 1, wherein the pressing piece is an exterior accessory of the electronic device.

4. The electronic device according to claim 3, wherein the exterior accessory comprises an exterior decorative disassembly part.

5. The electronic device according to claim 1, wherein a mounting groove is disposed on an inner side wall of the assembly hole, a protrusion is disposed on an outer side wall of the pressing piece, and the protrusion is clamped in the mounting groove.

6. The electronic device according to claim 1, wherein a protrusion is disposed on an inner side wall of the assembly hole, a mounting groove is disposed on an outer side wall of the pressing piece, and the protrusion is clamped in the mounting groove.

7. The electronic device according to claim 1, wherein a first step is disposed at an outer edge of the assembly hole on a side of the middle frame deviating from the screen component, and the pressing piece is assembled on the first step.

8. The electronic device according to claim 1, wherein the connector is disposed near a side of the main board.

9. The electronic device according to claim 1, wherein the screen component comprises a display screen and a touch panel that are stacked; and the touch panel is located on a side of the display screen deviating from the accommodating cavity.

10. The electronic device according to claim 9, wherein the screen component further comprises a mounting frame; and the mounting frame is disposed on a periphery of the display screen and the touch panel, and the mounting frame is connected to the middle frame.

11. The electronic device according to claim 10, wherein the mounting frame has a second step on a side facing the accommodating cavity, a third step is disposed on the middle frame, and the second step cooperates with the third step to achieve connection between the mounting frame and the middle frame.

12. The electronic device according to claim 1, further comprising a rear cover, wherein the rear cover is disposed on a side of the middle frame deviating from the screen component.

* * * * *